US010606326B2

(12) United States Patent
Saito

(10) Patent No.: US 10,606,326 B2
(45) Date of Patent: Mar. 31, 2020

(54) ELECTRONIC DEVICE FOR LIQUID IMMERSION COOLING

(71) Applicant: ExaScaler Inc., Chiyoda-ku, Tokyo (JP)

(72) Inventor: Motoaki Saito, Tokyo (JP)

(73) Assignee: EXASCALER INC., Chiyoda-Ku, Tokyo (JP)

( * ) Notice: Subject to any disclaimer, the term of this patent is extended or adjusted under 35 U.S.C. 154(b) by 0 days.

(21) Appl. No.: 16/302,596

(22) PCT Filed: May 16, 2016

(86) PCT No.: PCT/JP2016/064527
§ 371 (c)(1),
(2) Date: Nov. 16, 2018

(87) PCT Pub. No.: WO2017/199314
PCT Pub. Date: Nov. 23, 2017

(65) Prior Publication Data
US 2019/0294221 A1 Sep. 26, 2019

(51) Int. Cl.
*G06F 1/20* (2006.01)
*G06F 1/18* (2006.01)
(Continued)

(52) U.S. Cl.
CPC .......... *G06F 1/20* (2013.01); *G06F 1/18* (2013.01); *H05K 7/02* (2013.01); *H05K 7/20* (2013.01);
(Continued)

(58) Field of Classification Search
CPC ........ G06F 1/20; G06F 1/18; G06F 2200/201; G06F 11/0724; G06F 12/063;
(Continued)

(56) References Cited

U.S. PATENT DOCUMENTS

2009/0260777 A1 10/2009 Attlesey et al.
2014/0216686 A1* 8/2014 Shelnutt ............ H05K 7/20809
165/67
2014/0216711 A1 8/2014 Shelnutt et al.

FOREIGN PATENT DOCUMENTS

JP 2008205402 A 9/2008
JP 2011-518395 A 6/2011
JP 2016-46431 A 4/2016

OTHER PUBLICATIONS

International Search Report for related International Application No. PCT/JP2016/064527, dated Jun. 21, 2016; 2 pages.
(Continued)

*Primary Examiner* — Mandeep S Buttar
(74) *Attorney, Agent, or Firm* — Procopio, Cory, Hargreaves & Savitch LLP

(57) ABSTRACT

An electronic device, immersed in a coolant filled in a cooling apparatus, and directly cooled, is configured to be housed in a housing part of the cooling apparatus, and includes a pair of substrate groups that includes a first circuit board having at least one processor and main memories mounted onto one surface of the board, coprocessors, each having a housing with a rectangular cross-section, and an electric connection terminal, and a connector for electric connection between the first circuit board and the coprocessors. When each of the electric connection terminals of the coprocessors is inserted into the connector, a distance between the one surface of the first circuit board and a housing bottom surface of each of the coprocessors is longer than a height of the processor and each height of the main memories. The pair of substrate groups is combined while having the first circuit boards arranged at a rear surface side in a direction for reducing a distance between the one surface of the first circuit board of one of the substrate
(Continued)

groups and a housing upper surface of each of the coprocessors of the other of the substrate groups.

7 Claims, 4 Drawing Sheets

(51) Int. Cl.
*H05K 7/20* (2006.01)
*H05K 7/02* (2006.01)
(52) U.S. Cl.
CPC ..... *H05K 7/20236* (2013.01); *H05K 7/20263* (2013.01); *G06F 2200/201* (2013.01)
(58) Field of Classification Search
CPC .. G06F 12/0842; G06F 1/184; G06F 15/7864; H05K 7/02; H05K 7/20; H05K 7/20236; H05K 7/20263; H05K 1/141; H05K 1/181; H05K 2201/10159; H05K 2201/10189; H05K 1/14; H05K 7/20781; H05K 1/144; H05K 1/0203; H05K 7/20763; H01L 2924/00; H01L 2924/14; H01L 23/34; H01L 2225/06589; H01L 2225/1094; H01L 23/473; H01R 12/737
USPC .... 361/699, 719, 679.47, 748, 760; 174/260
See application file for complete search history.

(56) References Cited

OTHER PUBLICATIONS

ExaScaler Inc., et al.; Press Release; Mar. 31, 2015; Partial translation provided; 7 pages.
Nikkei Electronics,"Innovation of Semiconductor, Cooling, Connection Innovated with the Aim of Exa-class High-Performance Machine—Part I" Jun. 20, 2015, pp. 99-105, 13 pages, No. 1157, Nikkei Business Publications, Inc.; Partial Translation.
Decision to Grant a Patent for related JP App No. 2017-541890 dated Oct. 17, 2018, 6 pages.
International Preliminary Report on Patentability for related PCT App No. PCT/JP2016/064527 dated Nov. 29, 2018, 6 pages.
Extended European Search Report for related EP App No. 16902334.8 dated Nov. 29, 2019, 10 pgs.

* cited by examiner (a)

(b)

ELECTRONIC DEVICE FOR LIQUID IMMERSION COOLING

CROSS-REFERENCE TO RELATED APPLICATIONS

This application is a U.S. National Stage entry of PCT Application No: PCT/JP2016/064527 filed May 16, 2016, the contents of which are incorporated herein by reference.

TECHNICAL FIELD

The present invention relates to an electronic device. More specifically, the present invention relates to the electronic device immersed in the coolant filled in a cooling apparatus so as to be directly cooled. The electronic device described in the specification such as the supercomputer and data center is generally required to exhibit super-high performance and stable operation while generating high heating value. However, it is not limited to the one as described above.

BACKGROUND ART

Power consumption is one of the essential factors to determine the performance limit of the recent supercomputer. The importance of study on saving power consumed by the supercomputer has been widely recognized. That is, the speed performance per power consumption (Flops/W) is one of indexes for evaluating the supercomputer. In the case of the data center, the power for cooling operations accounts for approximately 45% of the power consumption of the entire data center. Reduction in the power consumption by improving cooling efficiency has been increasingly demanded.

Conventionally, the process for cooling the supercomputer and the data center has been performed through two different methods, that is, air cooling method and liquid cooling method. In general, the cooling efficiency of the liquid cooling method is better than that of the air cooling method because the heat transfer performance of liquid is superior to that of air. Especially, in comparison with the liquid immersion cooling system using synthetic oil, the liquid immersion cooling system using fluorocarbon-based coolant has received much attention because of the advantage in regards to the excellent maintainability for the electronic device (specifically, for example, adjustment, inspection, repair, replacement, extension and the like).

The inventor has already developed the compact liquid immersion cooling apparatus with excellent cooling efficiency suitable for the supercomputer of small-scale liquid immersion cooling type. Such apparatus has been applied to the compact supercomputer "Suiren" installed in the high-energy accelerator research organization, and operated (Non-patent Literature 1).

The inventor has also proposed the improved liquid immersion cooling apparatus configured to allow substantial improvement in packaging density of the electronic devices subjected to the liquid immersion cooling (Non-patent Literature 2).

CITATION LIST

Non-Patent Literature

Non-patent Literature 1: "Liquid immersion cooling compact supercomputer "ExaScaler-1" succeeded in measurement of the value corresponding to the world highest level of the latest supercomputer power consumption performance ranking "Green500" resulting from the performance improvement by 25% or higher" Mar. 31, 2015, Press Release, ExaScaler Inc., et al., URL:http://exascaler.co.jp/wp-content/uploads/2015/03/20150331.pdf Non-patent Literature 2: "Innovation of Semiconductor, Cooling, Connection, Aiming at Exa-grade High-performance Machine—Part I", July 2015 issue of Nikkei Electronics, pp. 99-105, Jun. 20, 2015, published by Nikkei Business Publications, Inc.

SUMMARY OF INVENTION

Technical Problem

There has been required to develop a newly configured electronic device applied to liquid immersion cooling apparatus, which allows further improvement in processing capabilities and packaging density by installing a plurality of processors and a plurality of coprocessors configured to mainly execute arithmetic operations in a limited volume.

There has also been required to develop a newly configured electronic device with excellent maintainability applied to liquid immersion cooling apparatus, which allows the processors and the coprocessors configured to mainly execute arithmetic operations while further improving packaging density.

Solution to Problem

In order to solve the above-described problem, the present invention provides an electronic device that is immersed in a coolant filled in a cooling apparatus, and directly cooled. The electronic device is configured to be housed in a housing part of the cooling apparatus, and includes a pair of substrate groups. Each of the substrate groups includes a first circuit board having at least one processor and a plurality of main memories being mounted onto one surface of the board, a plurality of coprocessors, each having a housing with a rectangular cross-section, and an electric connection terminal, and a connector for electric connection between the first circuit board and the coprocessors. A distance H1 between the one surface of the first circuit board and a housing bottom surface of each of the coprocessors, upon insertion of each of the electric connection terminals of the coprocessors into the connector is longer than a height of the processor and each height of the main memories. The pair of substrate groups are combined while having the first circuit boards arranged at a rear surface side in a direction for reducing a distance H2 between the one surface of the first circuit board of one of the substrate groups and a housing upper surface of each of the coprocessors of the other of the substrate groups.

In a preferred embodiment of the electronic device according to the aspect of the present invention, a ratio W:L between a width W of the first circuit board and a distance L from the one surface of the first circuit board of one of the substrate groups to one surface of the first circuit board of the other of the substrate groups may be set to be in a range from 1:1.5 to 1.5:1.

In a preferred embodiment of the electronic device according to the aspect of the present invention, when the pair of substrate groups are combined while having the first circuit boards arranged at the rear surface side, the distance H2 from the one surface of the first circuit board of one of the substrate groups to the housing upper surface of each of the coprocessors of the other of the substrate groups may be equal to or shorter than the distance H1.

In a preferred embodiment of the electronic device according to the aspect of the present invention, a plurality of sets of the substrate groups are provided, each including the first circuit board, the coprocessors, and the connector.

In a preferred embodiment of the electronic device according to the aspect of the present invention, each of the coprocessors may be a GPU (Graphics Processing Unit) or a GPGPU (General Purpose computing on GPU).

In a preferred embodiment of the electronic device according to the aspect of the present invention, the connector may be a connector for an input/output interface.

In a preferred embodiment of the electronic device according to the aspect of the present invention, the pair of substrate groups may be combined, each of which includes comb-like arranged coprocessors on the one surface of the first circuit board.

The above-described and other objects and advantages of the present invention will be clearly understood in reference to the following explanations of the embodiment. It is to be understood that the embodiment is described for exemplifying purposes, and therefore, the present invention is not limited to the one described herein.

DESCRIPTION OF EMBODIMENT

Figure 1:
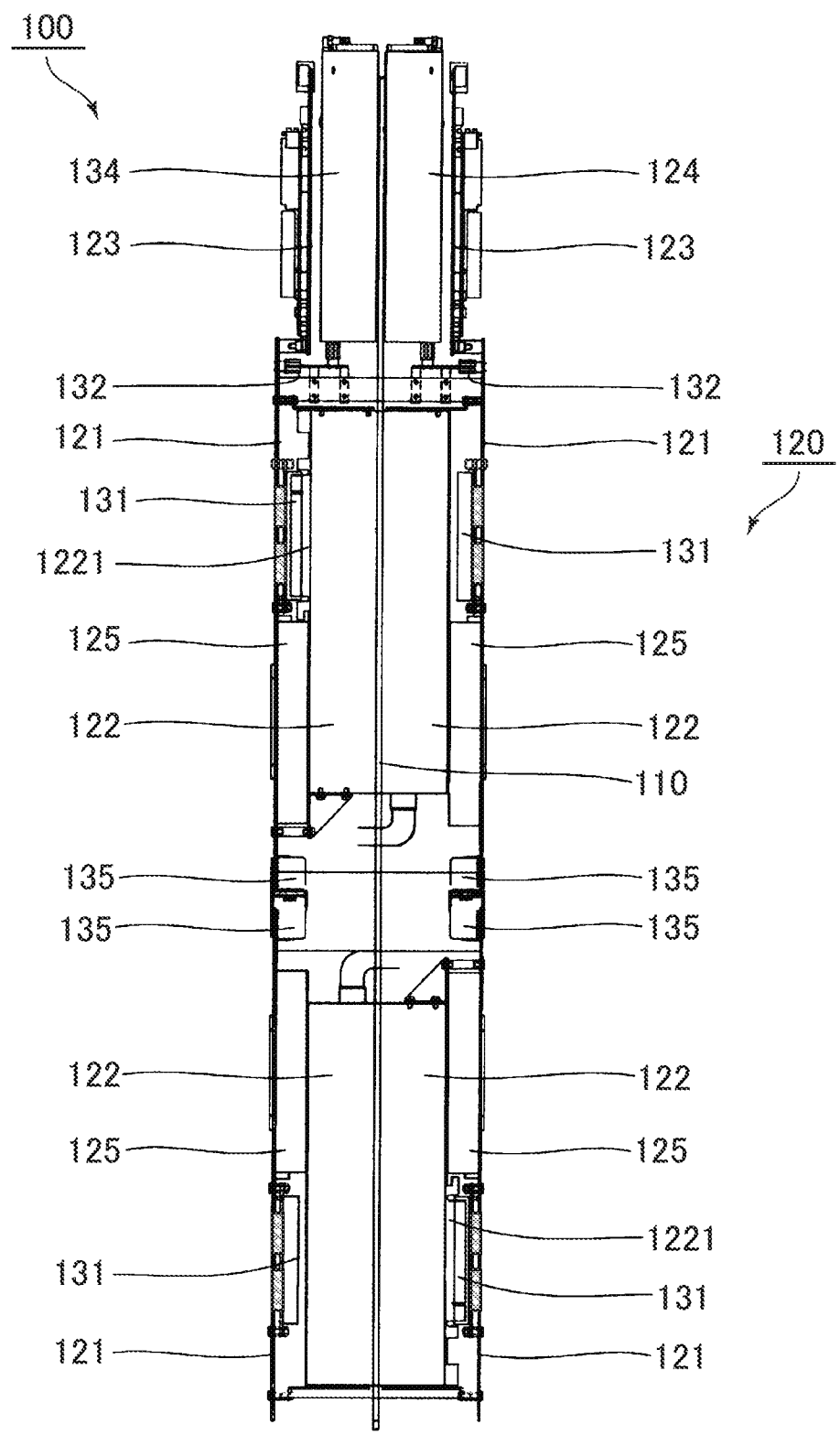
FIG. 1 is a front view of an electronic device according to an embodiment of the present invention.

A preferred embodiment of the electronic device according to the present invention will be described in detail referring to the drawings.

Figure 2:
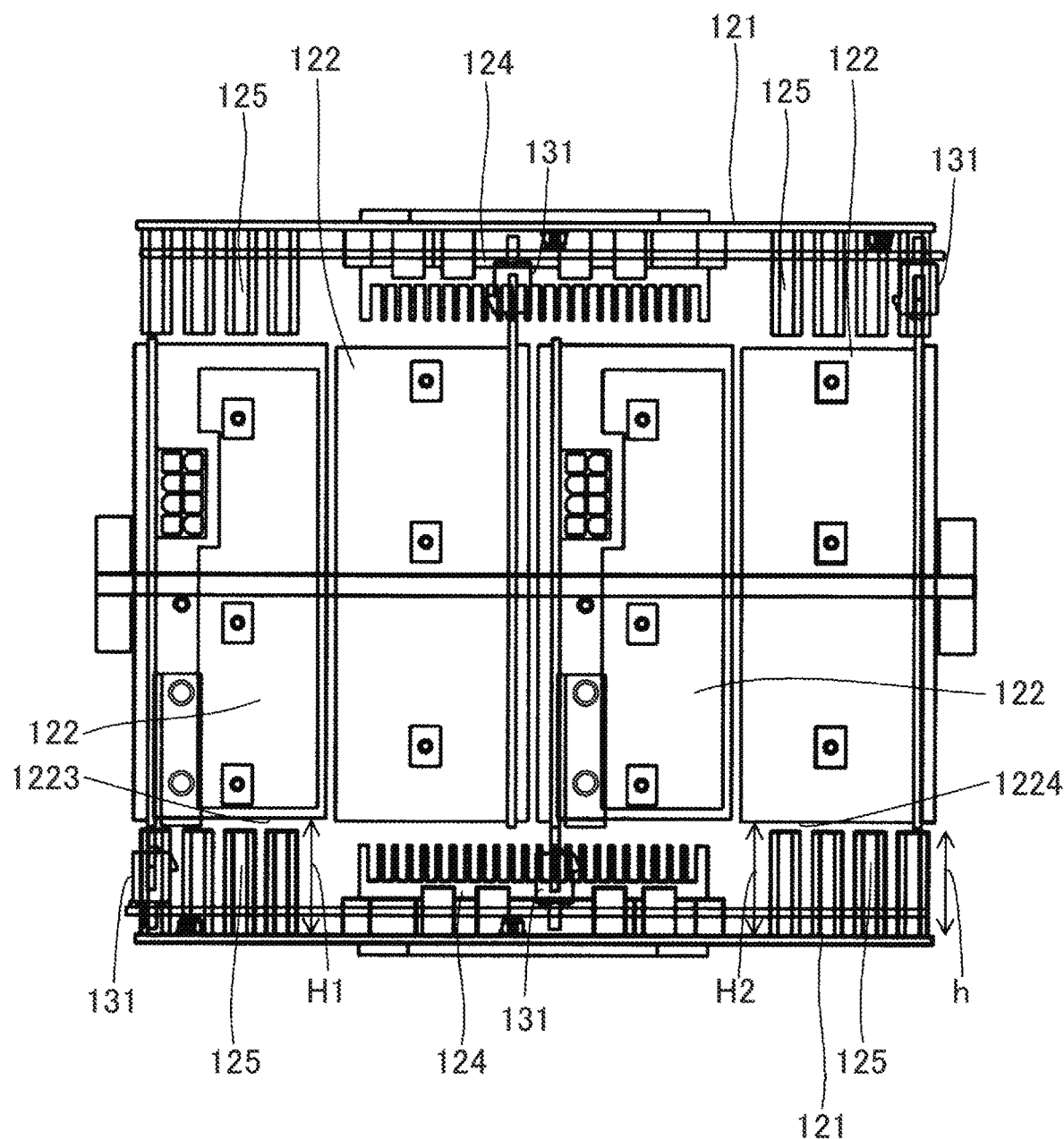
FIG. 2 is a bottom view of the electronic device according to the embodiment of the present invention.
Figure 3:
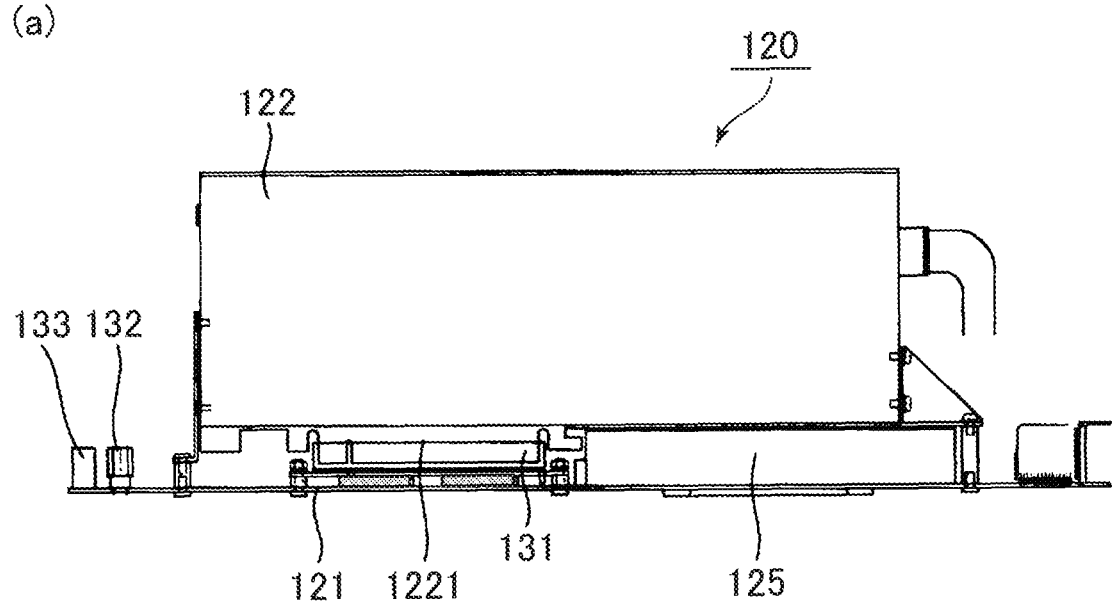
FIG. 3 is a view showing a substrate group of the electronic device according to the embodiment of the present invention.
Figure 3:
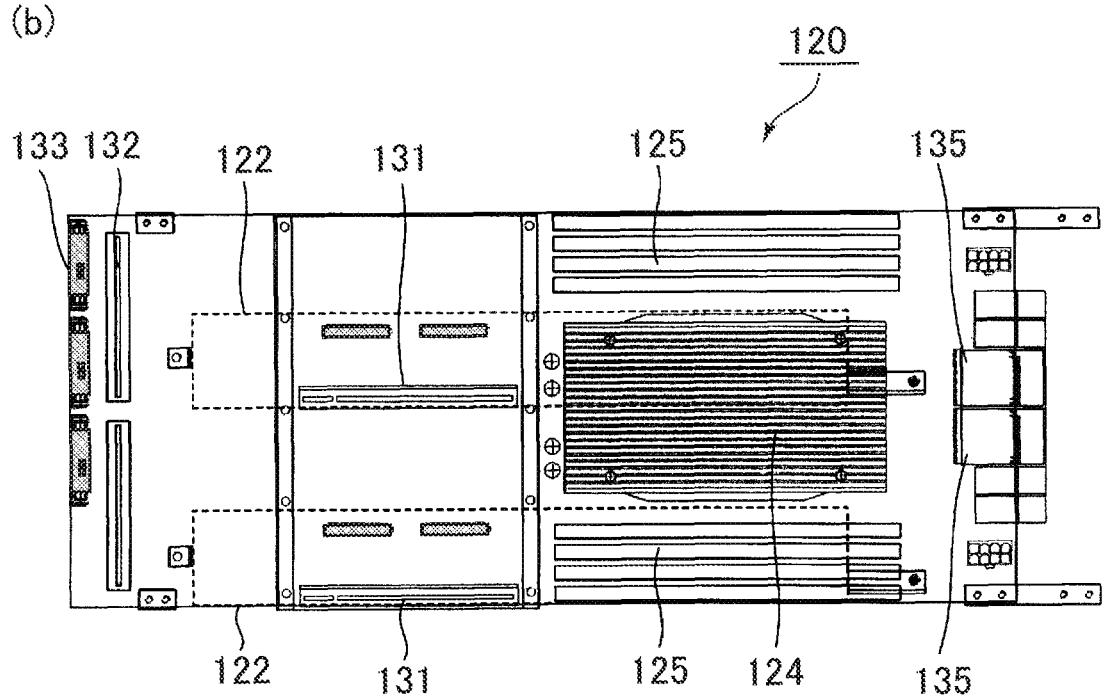

FIG. 1 is a front view of an electronic device 100 according to an embodiment of the present invention, and FIG. 2 is a bottom view. The electronic device 100 is immersed in the coolant filled in a cooling apparatus (not shown) so as to be directly cooled. It is configured to be housed in a housing part (not shown) of the cooling apparatus. The electronic device 100 includes a base board 110 that is retained with a pair of board retainers (not shown) of the housing part, and a pair of substrate groups 120 arranged to interpose the base board 110.

Figure 4:
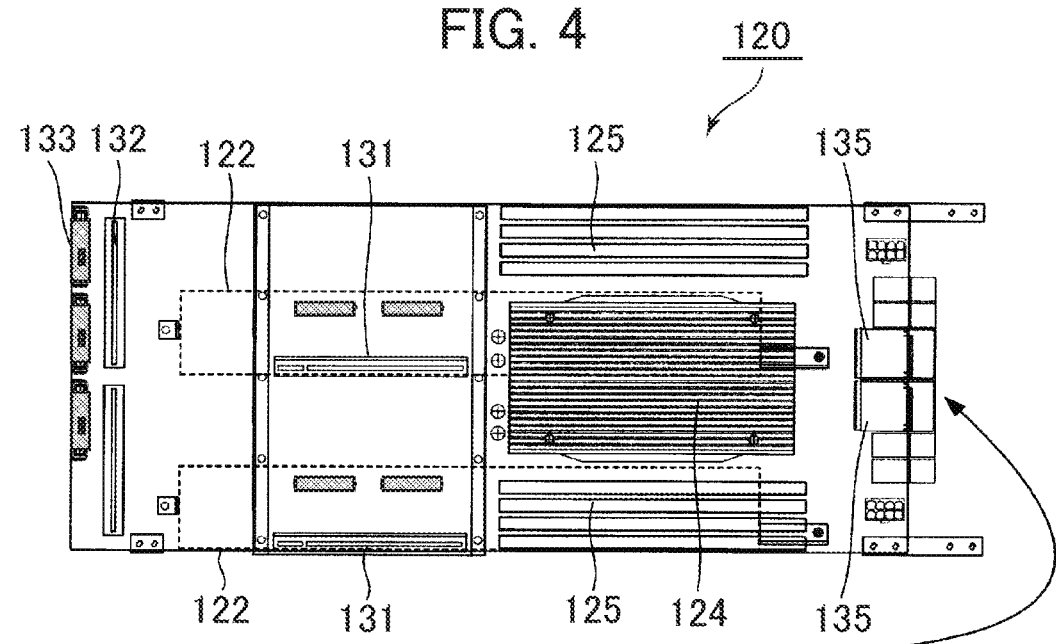
FIG. 4 is a view showing two sets of substrate groups of the electronic device according to the embodiment of the present invention.

Referring to the illustrated example, each substrate group 120 includes a first circuit board 121, a plurality of coprocessors 121, and a connector 131 for electric connection between the first circuit board 121 and the coprocessors 122. Each of the first circuit boards 121 has one processor 124 and eight main memories 125 mounted thereon. There are two sets of substrate groups 120 each including the first circuit board 121, the coprocessors 122, and the connector 131 as well as a component (not shown) for interconnection between the two processors. The respective sets each including the first circuit board 121, the coprocessors 122, the connector 131 are electrically connected through connectors 135 as shown in FIG. 4. Each number of the first circuit boards 121, the processors 124, the main memories 125, and the sets thereof is described for exemplifying purpose, which is not limited to the specific figures. The component for interconnection between the processors may be Intel's QPI (QuickPath Interconnect), for example. Additionally, the connector 131 may be the connector for an I/O interface (for example, PCI express).

Referring to the illustrated example, the first circuit board 121 of the substrate group 120 is connected to a second circuit board 123. The second circuit board 123 includes a network controller chip and a network cable socket. The first circuit board 121 and the second circuit board 123 are electrically connected through a connector 133.

Referring to the illustrated example, two slots 134 are formed in a first surface of the base board 110, and a second surface opposite the first surface parallel to the base board 110, respectively above the substrate groups 120. Each of the four slots 134 is configured to house the power unit.

A socket for the connector 132 is disposed on the bottom part of each of the respective slots for electric connection between the power unit and the first circuit board 121.

In the embodiment, the coolant circulating through one surface of the first circuit board 121 on which the processor 124 and the main memories 125 are mounted, and a surface opposite the one surface of the first circuit board 121 will take heat from the processor 124 immediately and efficiently. It is possible to thermally connect a heat radiating member (for example, heat sink) to the surface of the processor 124 so as to improve the cooling efficiency of the processor.

As shown in the drawing, each of the coprocessors 122 includes a housing with rectangular cross-section, and an electric connection terminal 1221. The coprocessor 122 may be a GPU (Graphics Processing Unit) or a GPGPU (General Purpose computing on GPU), which is not limited thereto. The base board 110 has two large openings allowing penetration of the coprocessors 122 therethrough. Referring to FIGS. 1 and 4, four coprocessors penetrate the respective openings of the base board 110.

In the embodiment, when the electric connection terminal 1221 of each of the coprocessors 122 is inserted into the connector 131, a distance H1 between one surface of the first circuit board 121 and a housing bottom surface 1223 of the coprocessor 122 is set to be longer than the height of the processor 124 (if the radiating member is further provided, each height of the processor and the radiating member will be included), and the height (h) of each of the main memories 125. A pair of substrate groups 120 are combined while having the first circuit boards 121 arranged at the rear surface side in a direction for reducing a distance H2 between the one surface of the first circuit board 121 of one of the substrate groups 120, and a housing upper surface of each of the coprocessors 122 of the other of the substrate groups 120. In the above-described case where the pair of substrate groups 120 are combined while having the first circuit boards 121 arranged at the rear surface side, the ratio W:L between a width W of the first circuit board 121, and a distance L between the one surface of the first circuit board 121 of one of the substrate groups 120 and one surface of the first circuit board 121 of the other of the substrate groups 120 may be set to be in the range from 1:1.5 to 1.5:1. This makes it possible to form the cross-section of the combined pair of the substrate groups 120 into a square or a quadrangle similar thereto.

Additionally, it is preferable to set the distance H2 between the one surface of the first circuit board 121 of one of the substrate groups 120 and a housing upper surface 1224 of each of the coprocessors 122 of the other of the substrate groups 120 to be equal to or shorter than the distance H1. In the above-described case, however, it is not necessary to make the pair of substrate groups 120 approaching with each other until the housing upper surface 1224 of the coprocessor 122 is brought into contact with the processor 124 or the main memories 125.

It is preferable to set the ratio between the number of the processors and the number of the coprocessors to 1:2, which is not limited thereto. Especially in the case of the GPU or the GPGPU, the housing size of the coprocessor is remarkably larger than the chip size of the processor (CPU: Central Processing Unit), for example, approximately 300 mm long. If three or more large-sized coprocessors are arranged in the length direction of the base board 110, the overall length of the base board 110 (or overall length of the electronic device 100) will become far longer than 1000 mm, resulting in handling difficulty as well as impracticality because of low packaging density of the processors and the coprocessors. The inventor has been working on development of the structure of the electronic device for liquid immersion cooling, which allows two or more processors and four or more coprocessors to be mounted in the limited volume simultaneously, and completed the present invention. The structure according to the embodiment allows mounting and arrangement of four coprocessors 122 each having the rectangular cross-section inside the substantially square longitudinal section of the electronic device 100 as shown in FIG. 2. Furthermore, the structure allows gaps between the processor and the coprocessor, and between the main memory and the coprocessor to be minimized. If the coprocessors 122 are arranged on one surface of the first circuit board in a comb-like manner, it is possible to combine the pair of substrate groups 120 with the structurally identical set including the first circuit board, the coprocessors, and the connector. The above-described structure is, thus, advantageous.

The present embodiment is capable of providing the electronic devices for liquid immersion cooling, having the coprocessors mounted with ultra-high density.

INDUSTRIAL APPLICABILITY

The present invention is widely applicable to the electronic device for liquid immersion cooling, having the processors and the coprocessors mounted with ultra-high density.

REFERENCE SIGNS LIST

100: electronic device,
110: base board,
120: substrate group,
121: first circuit board,
122: coprocessor,
1221: electric connection terminal,
1223: bottom surface,
1224: upper surface,
123: second circuit board,
124: processor,
125: main memory,
131, 132, 133, 135: connector,
134: slot

The invention claimed is:

1. An electronic device that is immersed in a coolant, in a cooling apparatus, and directly cooled, the electronic device being configured to be housed in a housing part of the cooling apparatus, and comprising a pair of substrate groups, wherein:
   each of the substrate groups includes a first circuit board having at least one processor and a plurality of main memories being mounted onto one surface of the first circuit board, a plurality of coprocessors, each having a housing with a rectangular cross-section, and an electric connection terminal, and a connector for electric connection between the first circuit board and the coprocessors;
   a distance H1 between the one surface of the first circuit board and a housing bottom surface of each of the coprocessors, upon insertion of each of the electric connection terminals of the coprocessors into the connector is longer than a height of the processor and each height of the main memories; and
   the pair of substrate groups are combined while having the first circuit boards arranged at a rear surface side in a direction for reducing a distance H2 between the one surface of the first circuit board of one of the substrate groups and a housing upper surface of each of the coprocessors of the other of the substrate groups.

2. The electronic device according to claim 1, wherein a ratio W:L between a width W of the first circuit board and a distance L from the one surface of the first circuit board of one of the substrate groups to one surface of the first circuit board of the other of the substrate groups is set to be in a range from 1:1.5 to 1.5:1.

3. The electronic device according to claim 1, wherein when the pair of substrate groups are combined while having the first circuit boards arranged at the rear surface side, the distance H2 from the one surface of the first circuit board of one of the substrate groups to the housing upper surface of each of the coprocessors of the other of the substrate groups is equal to or shorter than the distance H1.

4. The electronic device according to claim 1, wherein a plurality of sets of the substrate groups are provided, each including the first circuit board, the coprocessors, and the connector.

5. The electronic device according to claim 1, wherein each of the coprocessors is a GPU (Graphics Processing Unit) or a GPGPU (General Purpose computing on GPU).

6. The electronic device according to claim 1, wherein the connector is a connector for an input/output interface.

7. The electronic device according to claim 1, wherein the pair of substrate groups are combined, each including comb-like arranged coprocessors on the one surface of the first circuit board.

* * * * *